United States Patent [19]

Jones

[11] Patent Number: 4,652,977

[45] Date of Patent: Mar. 24, 1987

[54] MICROELECTRONICS MODULE

[75] Inventor: Arden D. Jones, Friendswood, Tex.

[73] Assignee: Schlumberger Technology Corporation, Houston, Tex.

[21] Appl. No.: 650,133

[22] Filed: Sep. 13, 1984

[51] Int. Cl.$^4$ .......................... H05K 1/11; H05K 1/14
[52] U.S. Cl. .................................... 361/414; 361/395; 361/410; 361/412; 339/17 M
[58] Field of Search ....... 174/685; 339/17 M, 17 LM, 339/17 N; 361/395, 396, 412, 413, 414, 400, 403, 410

[56] References Cited

U.S. PATENT DOCUMENTS

| | | | |
|---|---|---|---|
| 3,324,353 | 6/1967 | Retzlaff | 361/412 |
| 3,428,954 | 2/1964 | David | 361/412 |
| 4,322,778 | 3/1982 | Barbour | 361/414 |
| 4,349,862 | 9/1982 | Bajorek | 174/68.5 |

OTHER PUBLICATIONS

IBM Tech Discl Bull, vol. 22, No. 5, Oct. 1979, pp. 1841–1842, "Multilayer Ceramic ... Design", Johnson.
"A Comparison of Thin Film, Thick Film, and Co-Fired High Density Ceramic Multilayer with the Combined Technology: T&T HDCM (Thin Film and Thick Film High Density Ceramic Module)"; Dr. Terasawa and S. Minami and J. Rubin, Oct. 1983.

Primary Examiner—G. P. Tolin
Attorney, Agent, or Firm—Henry N. Garrana; Michael D. Rostoker

[57] ABSTRACT

A microelectronics module and method for fabricating a microelectronics module has an electronic surface mounted device soldered to a thick film multilayer circuit disposed on an interconnect ceramic substrate, and the interconnect ceramic substrate is soldered to a co-fired multilayer ceramic substrate having a plurality of pin conductors brazed to the underside of the co-fired multilayer ceramic substrate.

7 Claims, 5 Drawing Figures

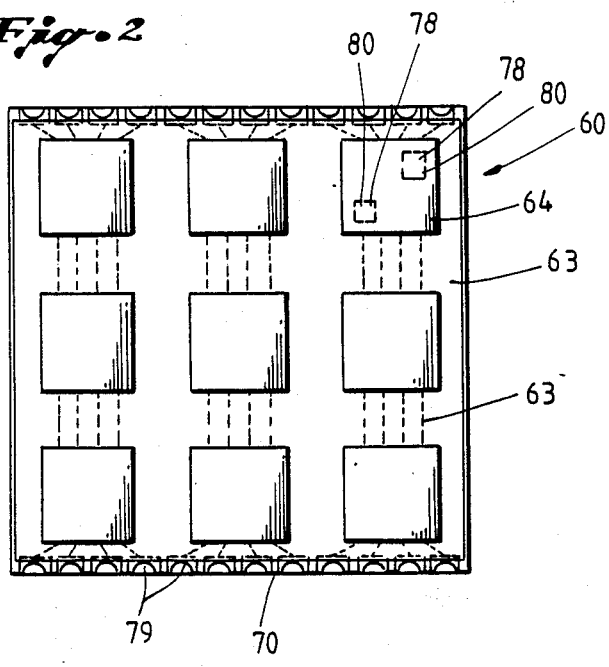
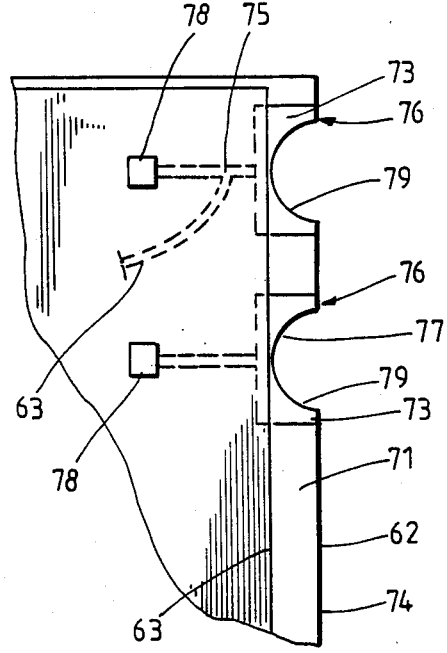
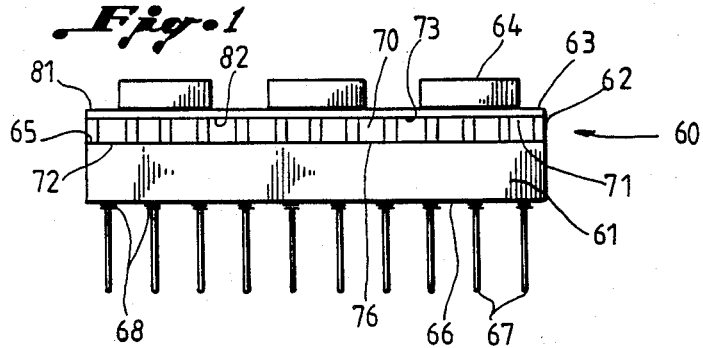
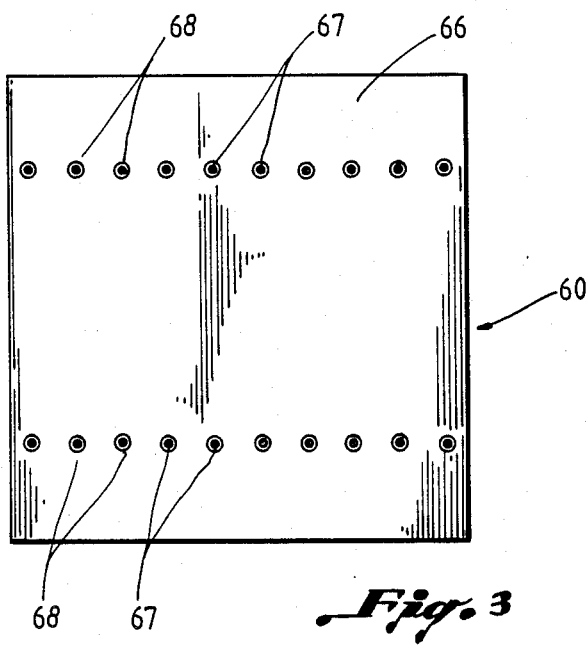
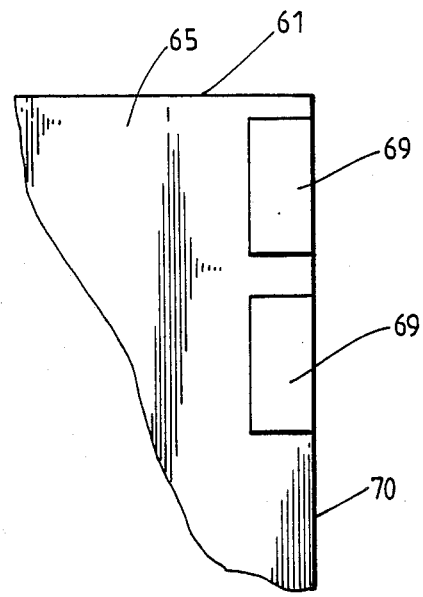

MICROELECTRONICS MODULE

FIELD OF THE INVENTION

The invention relates to: a microelectronics module; and a method for fabricating a microelectronics module, which module includes a co-fired multilayer ceramic substrate, an interconnect ceramic substrate, and at least one electronic chip carrier. The microelectronics module is particularly useful in a well-logging tool intended for use in a well borehole.

DESCRIPTION OF THE PRIOR ART

In well-logging tools, for use in a well borehole, numerous types of instrumentation are disposed within the well-logging tool to measure various types of information from the well borehole, as is well known in the art. In connection with such instrumentation, it is necessary to provide numerous microelectronic modules which are attached to circuit boards disposed within the well-logging tool. Typically, a microelectronic chip, or hybrid circuit board, is obtained and placed within a metal container. The hybrid circuit board, or chip, must be first tested, and then hermetically sealed within the metal container. Additionally, prior to sealing of the metal container, the chip must be glued to a substance, and wire leads must be connected between the substrate and the chip. Further, the substrate must be wire bonded to conventional interconnect pins in order for the completed microelectronic module to be plugged into a circuit board. The disadvantages associated with this prior art structure include the necessity of a great amount of tedious and detailed assembly steps, which result in a laborious and expensive assembly process.

With the advent of surface mounted devices, which can be microelectronic chips disposed within a hermetically sealed electronic chip carrier, some of the foregoing disadvantages have been eliminated. However, there are still disadvantages associated with such surface mounted devices, in that it is still necessary to utilize tedious, laborious, assembly steps. In order for the surface mounted device to be useful, numerous wire leads and interconnect pins must be provided to obtain a completed microelectronics module which can be pinned, and/or plugged into the desired circuit board.

Although off-the shelf electronic chip carriers can be mounted upon a ceramic substrate having a thick film multilayer circuit thereon, and connector pins can be attached to the underside of the ceramic substrate, such a microelectronics module is not readily usable in a well-logging tool. Well-logging instrumentation is subjected to a unique range of severe environmental conditions during the operation of such instrumentation, due to the combination of cycles of extreme temperature differentials and severe shock and vibration forces. Thus, it is necessary that the microelectronics module have high strength characteristics. In particular, the connection of the connector pins to the underside of the ceramic substrate must be particularly strong in view of the severe shock and vibration forces. The foregoing described module, having a chip carrier disposed upon a ceramic substrate with a thick film multilayer circuit disposed thereon, does not have the requisite strength characteristics for utilization in a well-logging tool, particularly the connection between the substrate and the connector pins. A further disadvantage of such a module is that the extreme temperature differentials, particularly the high temperatures, encountered by a well-logging tool can lead to degradation of the solder pads which would be utilized in connection with the manufacturing of such a module.

It may be contemplated to use a co-fired multilayer ceramic substrate with an electronic chip carrier disposed directly upon such substrate. Such substrate would have the requisite strength characteristics previously described; however, there are disadvantages associated with such a microelectronics module. Specifically, the production and tooling costs associated with a co-fired multilayer substrate are quite substantial in comparison with the costs of disposing such a circuit upon the type of ceramic substrate previously described, particularly when only limited numbers of such microelectronic modules are desired. Thus, it would be desirable to be able to manufacture a microelectronics module: having high strength characteristics, particularly with respect to the connection of the connector pins; able to withstand exposure to high temperatures without degradation; and having low production and tooling costs associated with its manufacture.

Accordingly, prior to the development of the present invention, there has been neither a microelectronics module, which includes an electronic chip carrier, a thick film hybrid circuit disposed on a ceramic substrate which is electrically connected to a co-fired multilayer ceramic substrate; nor a method for making such an microelectronics module which: can be readily fabricated; provides a structure which can withstand the extreme temperatures and severe shock and vibration forces experienced by a well-logging tool in a borehole; and is efficiently and economically assembled. Therefore, the art has sought a microelectronics module and a method for making a microelectronics module, for use with a well-logging tool within a well borehole, which: allows an electronic chip carrier to be combined with a thick film hybrid circuit disposed on a ceramic substrate, connected to a co-fired multilayer ceramic substrate; is efficiently and economically assembled; and is capable of withstanding the extreme temperatures and severe shock and vibration forces encountered by a well-logging tool within a borehole.

SUMMARY OF THE INVENTION

In accordance with the invention, the foregoing advantages have been achieved through the present microelectronics module. The present invention includes: a co-fired multilayer ceramic substrate having top and bottom surfaces with a plurality of pin conductors disposed on the bottom surface which are electrically connected to a first set of solder pads disposed on the top surface; an interconnect ceramic substrate, having upper and lower surfaces with a thick film multilayer circuit, having an upper and lower surface, disposed on the upper surface of the interconnect ceramic substrate, the circuit being electrically connected to a second set of solder pads disposed on the upper surface of the interconnect ceramic substrate, a third set of solder pads disposed on the lower surface of the interconnect ceramic substrate, the circuit including a fourth set of solder pads disposed on the upper surface of the circuit; at least one electronic surface mounted device, disposed on the upper surface of the circuit, the at least one electronic surface mounted device having at least one solder pad which is electrically connected to at least one of the fourth set of solder pads; and the first, second, and third sets of solder pads are disposed one above another in a mating relationship and are electrically and mechanically connected to each other by solder, whereby the electronic surface mounted device is electrically connected to the pin conductors.

A further feature of the present invention is that the second and third sets of solder pads may be disposed along at least one outer edge of the interconnect ceramic substrate. Another feature of the present invention is that at least one castellation may be formed in at least one outer edge of the interconnect ceramic substrate, and at least one solder pad of each of the second and third sets of solder pads may be disposed adjacent the at least one castellation.

Another feature of the present invention is that each solder pad of the second and third sets of solder pads may be disposed adjacent a castellation formed in an outer edge of the interconnect ceramic substrate, and further, each solder pad of the second and third sets of solder pads may be disposed contiguous with a castellation.

The present invention also includes a method of fabricating a microelectronics module, which includes a co-fired multilayer ceramic substrate, having top and bottom surfaces and at least one electronic surface mounted device. The method includes the steps of: disposing a plurality of pin conductors upon the bottom surface of the co-fired multilayer ceramic substrate and disposing a first set of solder pads on the top surface, the first set of solder pads being in an electrically connected relationship with the plurality of pin conductors; forming a thick film multilayer circuit, having upper and lower surfaces, upon an interconnect ceramic substrate, having upper and lower surfaces; disposing a second set of solder pads on the upper surface of the interconnect ceramic substrate in an electrically connected relationship with the circuit; disposing a third set of solder pads on the lower surface of the interconnect ceramic substrate; disposing a fourth set of solder pads on the upper surface of the circuit, and electrically connected to the circuit; disposing the interconnect ceramic substrate upon the co-fired multilayer ceramic substrate with the first, second and third sets of solder pads overlying one another in a mating relationship; electrically and mechanically connecting the multilayer and interconnect ceramic substrates by soldering the first, second and third sets of solder pads; and disposing the at least one electronic surface mounted device upon the fourth set of solder pads and soldering them together, whereby the electronic surface mounted device is in an electrically connected relationship with the plurality of pin conductors.

Another feature of the method of the present invention includes the step of utilizing reflow soldering to solder the first, second and third sets of solder pads together. An additional feature of the method of the present invention includes the step of disposing the second and third sets of solder pads along at least one outer edge of the interconnect ceramic substrate.

A further feature of the method of the present invention includes the step of forming at least one castellation in at least one outer edge of the interconnect ceramic substrate and disposing at least one solder pad of each of the second and third sets of solder pads adjacent the at least one castellation. Another feature of the method of the present invention includes the step of disposing the at least one solder pad of each of the second and third solder pads contiguous with the at least one castellation.

The microelectronics module and method for fabricating the microelectronics module, when compared with previously proposed microelectronic modules and methods for fabricating them, have the advantages of: combining pre-tested electronic chip carriers, or electronic surface mounted devices, with a thick film multilayer circuit associated with a co-fired multilayer ceramic substrate which is efficiently and economically fabricated; provides a microelectronics module which can withstand the extreme temperatures and severe shock and vibration forces encountered by a well-logging tool in a borehole; and allows separate manufacturing processes to be utilized to make the co-fired multilayer ceramic substrate and the interconnect ceramic substrate having the thick film multilayer circuit and electronic chip carrier mounted thereon, whereby optimal technology can be utilized to efficiently and economically manufacture those separate components.

BRIEF DESCRIPTION OF THE DRAWINGS

In the drawings:
FIG. 1 is a side view of a microelectronics module in accordance with the present invention;
FIG. 2 is a top view of the microelectronics module in accordance with the present invention;
FIG. 3 is a bottom view of the microelectronics module in accordance with the present invention;
FIG. 4 is an exploded view of a portion of the microelectronics module in accordance with the present invention; and
FIG. 5 is an exploded view of a portion of a microelectronics module in accordance with the present invention.

While the invention will be described in connection with the preferred embodiment it will be understood that it is not intended to limit the invention to that embodiment. On the contrary, it is intended to cover all alternatives, modifications, and equivalents as may be included within the spirit and scope of the invention as defined by the appended claims.

DETAILED DESCRIPTION OF THE DRAWINGS

With reference to FIGS. 1-3, a microelectronics module 60, in accordance with the present invention, generally includes: a co-fired multilayer ceramic substrate 61; an interconnect ceramic substrate 62, having a thick film multilayer circuit 63 disposed thereon; and at least one electronic surface mounted device 64 disposed on the circuit and interconnect ceramic substrate 62. Co-fired multilayer ceramic substrate 61 has top and bottom surfaces 65, 66, and a plurality of pin conductors 67 are disposed on the bottom surface 66 of substrate 61. Ceramic substrate 61 may be preferably formed by screen printing metallization patterns on unfired alumina sheets and the sheets are then co-fired into a rigid body. Refractory metal, such as tungsten, is used for metallization. The metallization pattern provides conductors (not shown) within substrate 61, which run from pin conductors 67 to a first set of solder pads to be hereinafter described. Preferably, substrate 61 is formed of a ceramic composition of between 90–92% alumina oxide ($Al_2O_3$). Pin conductors 67 may preferably be pins made of Kovar which are brazed to pads 68 disposed upon the bottom surface 66 of substrate 61. Preferably, pads 68 are formed of gold over tungsten and the Kovar pins 67 are preferably gold-plated. Pin conductors 67, and pads 68, are in an electrically connected relationship to the metallization pattern disposed within substrate 61. It should be understood that other types of pin conductors 67, could be utilized, as well as other methods for attaching pin conductors 67 to the bottom surface 66 of substrate 61, could be utilized as is conventional in the art. It should be noted that a major advantage of utilizing a co-fired multilayer ceramic substrate 61 is that it has the desired high-strength characteristics which are desirable for microelectronic moduels utilized within a well-logging tool (not shown) utilized in a well borehole (not shown), as well as allows pin conductors 67 to be easily and efficiently brazed to substrate 61 to provide a strong connection between pin conductors 67 and substrate 61.

With reference to FIG. 4, the top surface 65 of substrate 61 is illustrated in greater detail, wherein a first set of solder pads 69 are illustrated. Solder pads 69 are preferably disposed along an outer edge 70 of substrate 61. Solder pads 69 are preferably made of gold over a tungsten base. Solder pads 69 are in an electrically connected relationship with the metallization pattern disposed within substrate 61, whereby the first set of solder pads 69 are in an electrically connected relationship with the pin conductors 67.

With reference now to FIGS. 1, 2 and 5, interconnect ceramic substrate 62 will be described in greater detail. Interconnect ceramic substrate 62 has upper and lower surfaces 71, 72, and has a thick film multilayer circuit 63 formed on the upper surface 71 of substrate 62. Substrate 62 may preferably be made of a 96% alumina oxide composition. Circuit 63, having upper and lower surfaces 81 and 82, is formed by metallization patterns using a typical thick film conductor metal, such as gold, as is conventional in the art. A second set of solder pads, 73 is disposed on the upper surface 71 of substrate 62, which solder pads 73 are disposed adjacent an outer edge 74 of substrate 62. Preferably, the second set of solder pads 73, are disposed contiguous with the outer edge 74 of substrate 62. As seen in FIGS. 2 and 5, the second set of solder pads 73 is in an electrically connected relationship with circuit 63 by conductor material disposed within the layers of dielectric which form circuit 63, as shown at 75. It should be noted that thick film multilayer circuit 63 is illustrated schematically, and may be of any desired design, dependent upon the particular functions to be performed by the microelectronics module 60. The second set of solder pads 73 are also preferably formed by gold over a tungsten base.

A third set of solder pads 76 are disposed on the lower surface 72 of interconnect substrate 62. Pads 76 are a mirror image of the second set of solder pads 73, and preferably have the same configuration and construction. Preferably, a conductor material 77, which is preferably MULTIFIRE® 3580 manufactured by Thick Film Systems of Santa Barbara, Calif, is disposed between the second and third sets of solder pads 73 and 76, and wraps around interconnect ceramic substrate 62 from the upper surface 71 to the lower surface 72 of substrate 62. Thus, each of the solder pads 73 is preferably in an electrically connected relationship with its mating solder pad 76, which is disposed in a superimposed, mating relationship beneath solder pad 73 on the lower surface 72 of substrate 62. As seen in FIGS. 1, 2 and 5, the second and third sets of solder pads 73, 76 are disposed along, and preferably contiguous, with outer edge 74 of interconnect substrate 62.

With reference to FIG. 5 it is seen that a fourth set of solder pads 78 are disposed and exposed on the upper surface 81 of circuit 63. The fourth set of solder pads 78 are also in an electrically connected relationship to circuit 63, as well as to the second set of solder pads 73. Preferably, at least one castellation, or semi-circular opening, is formed in outer edge 74 of interconnect substrate 62; and castellation 79 extends from the upper surface 71 to the lower surface 72 of interconnect substrate 62. At least one solder pad, and preferably all of the solder pads 73, 76, of the second and third sets of solder pads 73, 76, are disposed adjacent, and preferably contiguous, with castellations 79, as seen in FIG. 5. Castellations 79 provide for ease of allowing thick layer conductor material 77 to be wrapped around interconnect ceramic substrate 62 so that conductor material 77 extends from the upper surface 71 to the lower surface 72 of interconnect substrate 62.

With reference to FIGS. 1 and 2, it is seen that at least one electronic surface mounted device, or electronic chip carrier 64, or as many electronic devices 64 as are necessary, are disposed on the upper surface 81 of circuit 63. Electronic surface mounted devices 64 may include solder pads 80 disposed on the underside of electronic surface mounted devices 64. As shown in dotted lines in FIG. 2, electronic surface mounted devices 64 may be attached to the upper surface 81 of circuit 63 by disposing the devices 64 upon the fourth set of solder pads 78. Upon passing interconnect ceramic substrate 62 and devices 64 through a conventional furnace, the surface mounted devices 64 are electrically and mechanically connected to the circuit 63 and interconnect substrate 62. It should be noted that in the embodiment shown and described that electronic surface mounted devices 64 are electronic chip carriers, or microelectronic chips, disposed within a hermetically sealed electronic chip carriers. It should be understood to one of ordinary skill in the art that such surface mounted devices could be other electronic devices such as capacitors, etc.

As illustrated in FIGS. 1 and 2, interconnect ceramic substrate 62 is disposed with its lower surface 72 in contact with the top surface 65 of multilayer ceramic substrate 61, whereby the first, second, and third sets of solder pads 69, 73, and 76 are in a mating relationship. Thus, the three sets of solder pads 69, 73 and 76 are in a superimposed, overlying configuration. The interconnect ceramic substrate 62 may then be mechanically and electrically connected to the co-fired multilayer ceramic substrate 61 by soldering them to one another. Preferably, the soldering step is performed by utilizing reflow soldering, wherein a solder paste, preferably a mixture of 80% gold, 20% tin, is placed within castellations 79. Substrates 61 and 62 are then passed through a conventional furnace (not shown) wherein the metal flakes suspended in the solder flux, reflow into solder, thus electrically and mechanically connecting substrates 61 and 62. Accordingly, the electronic chip or hybrid circuit board, (not shown) contained within chip carrier 64 is electrically connected (via solder pads 80 and 78, circuit 63, solder pads 69, 73, and 76 conductor material 77, and the metallization pattern (not shown) within substrate 61) to pin conductors 67. Thus, the microelectronic module 60 is ready to be attached in any suitable manner to the desired circuit board, which may for example be contained within a well-logging tool (not shown) utilized in a well borehole (not shown). It should be noted that were castellations 79 to be provided in interconnect ceramic substrate 62, as illustrated in FIG. 5, and a sufficient amount of solder paste is utilized to fill the castellation, or semi-circular opening, 79 it could be possible to eliminate conductor material 77 in that the solder could provide the electrical connection between the second and third sets of solder pads 73, 76.

Preferably, the chip carriers 64 are first soldered to the circuit 63 and interconnect ceramic substrate 62, whereby the thick film multilayer circuit and microelectronic chip contained within chip carrier 64 may be electrically tested. Thereafter, the interconnect ceramic substrate 62 is electrically and mechanically connected to the co-fired multilayer substrate 61 in the manner previously described. It should of course be understood that interconnect ceramic substrate 62 could be first joined to the co-fired multilayer substrate 61, and thereafter the electronic chip carriers 64 soldered to the circuit 63 and interconnect substrate 62.

It is to be understood that the invention is not limited to the exact details of construction, operation, exact materials, or embodiment shown and described, as obvious modifications and equivalents will be apparent to one skilled in the art; for example, the rectangular configuration of the three sets of solder pads could be any other desired configuration, as well as a rectangular configuration could be utilized in place of the castellations, or semi-circular openings. Accordingly, the invention is therefore to be limited only by the scope of the appended claims.

I claim:
1. A microelectronics module comprising:
    (a) a co-fired multilayer ceramic substrate, having top and bottom surfaces, with a plurality of pin conductors disposed on the bottom surface which are electrically connected to a first set of solder pads disposed on the top surface;
    (b) an interconnect ceramic substrate, having upper and lower surfaces, with a thick film multilayer circuit having an upper and lower surface disposed on the upper surface of the interconnect ceramic substrate, the circuit being electrically connected to a second set of solder pads disposed on the upper surface of the interconnect ceramic substrate, a third set of solder pads disposed on the lower surface of the interconnect ceramic substrate, the circuit including a fourth set of solder pads disposed on the upper surface of the circuit;
    (c) at least one electronic surface mounted device disposed on the upper surface of the circuit, the at least one electronic surface mounted device having at least one solder pad which is electrically connected to at least one solder pad of the fourth set of solder pads; and
    (d) the first, second and third sets of solder pads are disposed one above another in a mating relationship and are electrically and mechanically connected to each other by solder, whereby the electronic surface mounted device is electrically connected to the pin conductors.

2. The microelectronic module of claim 1, wherein the second and third sets of solder pads of the interconnect ceramic substrate have a conductor material disposed therebetween which wraps around the interconnect ceramic substrate from the upper surface to the lower surface thereof.

3. The microelectronic module of claim 2, wherein the second and third sets of solder pads are disposed adjacent at least one outer edge of the interconnect ceramic substrate.

4. The microelectronic module of claim 3, wherein at least one castellation is formed in at least one outer edge of the interconnect ceramic substrate, and at least one solder pad of each of the second and third sets of solder pads is disposed adjacent the at least one castellation.

5. The microelectronic module of claim 4, wherein at least one solder pad of each of the second and third sets of solder pads is disposed contiguous with the at least one castellation.

6. The microelectronic module of claim 3, wherein each solder pad of the second and third sets of solder pads is disposed adjacent a castellation formed in an outer edge of the interconnect ceramic substrate.

7. The microelectronic module of claim 6, wherein each solder pad of the second and third sets of solder pads is disposed contiguous with a castellation.

* * * * *